US010468616B2

(12) United States Patent
Oooka et al.

(10) Patent No.: US 10,468,616 B2
(45) Date of Patent: Nov. 5, 2019

(54) PHOTOELECTRIC CONVERSION DEVICE AND METHOD OF MANUFACTURING THE SAME

(71) Applicant: Kabushiki Kaisha Toshiba, Minato-ku (JP)

(72) Inventors: Haruhi Oooka, Kawasaki (JP); Atsuko Iida, Yokohama (JP); Hideyuki Nakao, Setagaya (JP); Kenji Todori, Yokohama (JP); Takeshi Gotanda, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 48 days.

(21) Appl. No.: 15/679,286

(22) Filed: Aug. 17, 2017

(65) Prior Publication Data

US 2018/0026216 A1 Jan. 25, 2018

Related U.S. Application Data

(62) Division of application No. 15/079,562, filed on Mar. 24, 2016, now abandoned.

(30) Foreign Application Priority Data

Mar. 30, 2015 (JP) ................................ 2015-068300

(51) Int. Cl.
*H01L 51/00* (2006.01)
*H01L 51/42* (2006.01)

(52) U.S. Cl.
CPC ...... *H01L 51/4253* (2013.01); *H01L 51/0007* (2013.01); *H01L 51/0026* (2013.01);
(Continued)

(58) Field of Classification Search
CPC ........................ H01L 51/4253; H01L 51/0026
See application file for complete search history.

(56) References Cited

U.S. PATENT DOCUMENTS

2009/0032808 A1* 2/2009 Bazan .................... B82Y 10/00 257/40
2009/0108255 A1 4/2009 Bazan et al.
(Continued)

FOREIGN PATENT DOCUMENTS

JP 2012-39097 2/2012
JP 2013-21070 1/2013
(Continued)

OTHER PUBLICATIONS

WO2013008579A1, translated, 2013. (Year: 2013).*
(Continued)

*Primary Examiner* — Robert A Vetere
(74) *Attorney, Agent, or Firm* — Oblon, McClelland, Maier & Neustadt, L.L.P.

(57) ABSTRACT

A method of manufacturing a photoelectric conversion device of an embodiment includes: forming a layer on a substrate; and drying this layer. The layer contains a p-type semiconductor, an n-type semiconductor, and a compound represented by the following formula (1). The layer is dried under pressures of 100 Pa or less and substrate temperatures of 40 to 200° C.

$$R^1—(CH_2)_n—R^2 \quad (1)$$

Here, n: 1 to 20, and R1, R2: halogen or SH

12 Claims, 2 Drawing Sheets

(52) U.S. Cl.
CPC ...... *H01L 51/0036* (2013.01); *H01L 51/0043* (2013.01); *H01L 51/0046* (2013.01); *H01L 2251/308* (2013.01); *Y02E 10/549* (2013.01); *Y02P 70/521* (2015.11)

(56) References Cited

U.S. PATENT DOCUMENTS

| | | | | |
|---|---|---|---|---|
| 2012/0322966 | A1 | 12/2012 | Bazan et al. | |
| 2013/0277658 | A1 | 10/2013 | Bazan et al. | |
| 2014/0080986 | A1 | 3/2014 | Bazan et al. | |
| 2014/0084220 | A1 * | 3/2014 | Inagaki | H01L 51/0036 252/511 |
| 2014/0124710 | A1 | 5/2014 | Izawa et al. | |
| 2014/0158203 | A1 | 6/2014 | Etori | |
| 2014/0360585 | A1 * | 12/2014 | Sugiura | H01L 51/0036 136/263 |
| 2015/0047710 | A1 | 2/2015 | Narayan | |

FOREIGN PATENT DOCUMENTS

| | | | | |
|---|---|---|---|---|
| JP | 2013-42085 | | 2/2013 | |
| JP | 2013-187501 | | 9/2013 | |
| JP | 2014-3255 | | 1/2014 | |
| JP | 2014-88559 | | 5/2014 | |
| JP | 2015-26716 | | 2/2015 | |
| WO | WO 2012/133794 | A1 | 10/2012 | |
| WO | WO-2013008579 | A1 * | 1/2013 | H01L 51/0026 |
| WO | WO 2013/122063 | A1 | 8/2013 | |

OTHER PUBLICATIONS

Yan Yao, et al., "Effects of Solvent Mixtures on the Nanoscale Phase Separation in Polymer Solar Cells", Advanced Functional Materials, (18), 2008, 7 pgs.

Jae Kwan Lee et al., "Processing Additives for Improved Efficiency from Bulk Heterojunction Solar Cells", JACS Articles Chem. Soc., vol. 130, (11), 2008, 5 pgs.

Japanese Office Action dated Oct. 25, 2016 in Patent Application No. 2015-068300 (w/English translation).

Shizuyasu Ochiai et al., "Characteristics Evaluation of the Organic Thin Film Solar Cell Using a PBDTTT-CF/PCBM Composite Thin Film", Aichi Institute of Technology, Bulletin of Research Institute for Industrial Technology, vol. 15, Sep. 20, 2013, 7 pages.

Office Action dated Jan. 31, 2017 in Japanese Application No. 2015-068300 filed Mar. 30, 2015 (w/computer-generated English translation).

Shizuyasu Ochiai, et al., "Characteristics evaluation of the organic thin film solar cell using a PBDTTT-CF/PCBM composite thin film", Aichi Institute of Technology, Sep. 30, 2013, No. 15, pp. 21-25.

* cited by examiner

PHOTOELECTRIC CONVERSION DEVICE AND METHOD OF MANUFACTURING THE SAME

CROSS REFERENCE TO RELATED APPLICATION

This application is a division of and claims the benefit of priority under 35 U.S.C. § 120 from U.S. application Ser. No. 15/079,562 filed Mar. 24, 2016, and claims the benefit of priority under 35 U.S.C. § 119 from Japanese Patent Application No. 2015-068300 filed Mar. 30, 2015; the entire contents of each of which are incorporated herein by reference.

FIELD

Embodiments described herein relate generally to a photoelectric conversion device and a method of manufacturing the same.

BACKGROUND

In recent years, an organic photovoltaic cell having an organic semiconductor film has been examined due to simplification of a manufacturing process. Since an organic semiconductor thin film can be formed by a coating method, simplification of a process of manufacturing a photovoltaic cell and a reduction in power generation cost are expected.

There has been known an organic photovoltaic cell having a bulk hetero junction type photoelectric conversion active layer. In the bulk hetero junction type photoelectric conversion active layer, an electron donating organic semiconductor (p-type organic semiconductor) and an electron accepting organic semiconductor (n-type organic semiconductor) are mixed, so that the bulk hetero junction type photoelectric conversion active layer has a large area of a pn junction interface where charge separation occurs.

When the bulk hetero junction type photoelectric conversion active layer is formed by a coating method, a coating solution containing a p-type organic semiconductor, an n-type organic semiconductor, and a solvent is used as a main component. In order to form a photoelectric conversion active layer excellent in power conversion efficiency, an alkane compound whose end is halogen-substituted (for example, 1,8-diiodooctane) is added to the coating solution.

In many cases, power conversion efficiency of a photovoltaic cell decreases as the photovoltaic cell is used. That is, the photovoltaic cell which power conversion efficiency significantly decreases during use is far to be practical, even though its power conversion efficiency is high immediately after manufacture.

DETAILED DESCRIPTION

A method of manufacturing a photoelectric conversion device of an embodiment includes: forming a layer on a substrate; and drying this layer. The layer contains a p-type semiconductor, an n-type semiconductor, and a compound represented by the following formula (1). The layer is dried under pressures of 100 Pa or less and substrate temperatures of 40 to 200° C.

$$R^1\text{—}(CH_2)_n\text{—}R^2 \quad (1)$$

Here, n: 1 to 20, R1, R2: halogen or SH

Hereinafter, there will be explained modes for carrying out the present invention. First, there will be explained a photoelectric conversion device of an embodiment.

Figure 1:
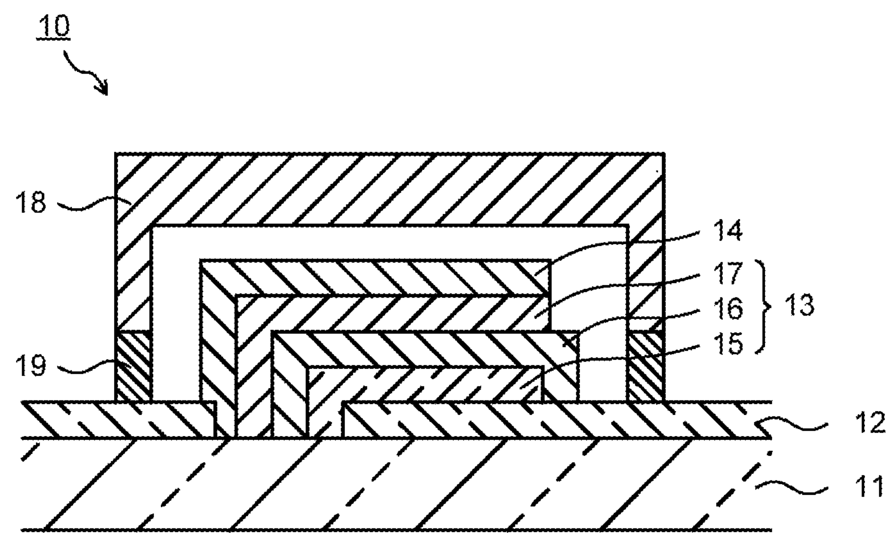
FIG. 1 is a cross-sectional view illustrating a photoelectric conversion device of an embodiment.

FIG. 1 is a cross-sectional view illustrating an organic photovoltaic cell (organic solar cell) as the photoelectric conversion device of the embodiment.

An organic photovoltaic cell 10 includes a supporting substrate 11. On the supporting substrate 11, a pair of first electrode layers 12 is disposed. On the first electrode layer 12 on the right of the drawing, a photoelectric conversion layer 13 is disposed. On the photoelectric conversion layer 13, a second electrode layer 14 is disposed. The second electrode layer 14 is electrically connected to the first electrode layer 12 on the left of the drawing. Further, on the supporting substrate 11, a sealing substrate 18 is disposed. The sealing substrate 18 covers the photoelectric conversion layer 13 and the second electrode layer 14, and is fixed on the supporting substrate 11 by an adhesive layer 19.

The photoelectric conversion layer 13 includes: a first intermediate layer 15; an organic active layer 16 as a photoelectric conversion active layer, and a second intermediate layer 17 in the order from the first electrode layer 12. The organic active layer 16 contains a p-type semiconductor, an n-type semiconductor, and a compound represented by the following formula (1).

$$R^1\text{—}(CH_2)_n\text{—}R^2 \quad (1)$$

Here, n: 1 to 20

R1, R2: halogen (fluorine (F), chlorine (Cl), bromine (Br), or iodine (I)) or SH Light such as sunlight or illumination light is emitted to the photoelectric conversion layer 13 from the supporting substrate 11, for example. The light emitted to the photoelectric conversion layer 13 is absorbed by the organic active layer 16. This causes charge separation at a phase interface between the p-type semiconductor and the n-type semiconductor to generate an electron and its paired hole. Out of electrons and holes generated in the organic active layer 16, the electrons are collected in the first electrode layer 12 and the holes are collected in the second electrode layer 14, for example.

In the case when light is emitted from the supporting substrate 11, the supporting substrate 11 is constituted of a material having a light transmission property. As a constituent material of the supporting substrate 11, an inorganic material or an organic material can be used. Examples of the inorganic material are non-alkali glass, quartz glass, and sapphire. Examples of the organic material are polyethylene, polyethylene terephthalate (PET), polyethylene naphthalate (PEN), polyimide, polyamide, polyamide-imide, and a liquid crystal polymer.

In the case when light is emitted from the supporting substrate 11, the first electrode layer 12 is constituted of a material having a light transmission property and conductivity. As a constituent material of the first electrode layer 12, there can be used a conductive metal oxide, a metal and a conductive polymer. Examples of the conductive metal oxide are an indium oxide, a zinc oxide, a tin oxide, an indium tin oxide (ITO), a fluorine-doped tin oxide (FTO), an indium-zinc oxide (IZO), and an indium-gallium-zinc oxide (IGZO). Examples of the metal are gold, platinum, silver, copper, titanium, zirconium, cobalt, nickel, indium, and aluminum, and an alloy containing these metals. Examples of the conductive polymer are poly (3,4-ethylenedioxythiophene)/poly(4-styrenesulfonic acid) (PEDOT/PSS). The first electrode layer 12 can be formed by, for example, a vacuum deposition method, a sputtering method, an ion plating method, a plating method, a coating method, or the like.

The organic active layer 16 has a function to perform charge separation by the emitted light, and contains the p-type semiconductor, the n-type semiconductor, and the compound represented by the formula (1). For the p-type semiconductor, a material having an electron donating property is used. For the n-type semiconductor, a material having an electron accepting property is used. One or both of the p-type semiconductor and the n-type semiconductor constituting the organic active layer 16 may be an organic material.

For the p-type semiconductor contained in the organic active layer 16, there can be used one or a plurality of materials selected from among polythiophene and its derivative, polypyrrole and its derivative, a pyrazoline derivative, an arylamine derivative, a stilbene derivative, a triphenyldiamine derivative, oligothiophene and its derivative, polyvinyl carbazole and its derivative, polysilane and its derivative, a polysiloxane derivative having aromatic amine at a side chain or a main chain, polyaniline and its derivative, a phthalocyanine derivative, porphyrin and its derivative, polyphenylene vinylene and its derivative, and polythienylene vinylene and its derivative.

As the n-type semiconductor contained in the organic active layer 16, fullerene or a fullerene derivative is preferably used. Examples of the fullerene are $C_{60}$, $C_{70}$, $C_{76}$, $C_{78}$, and $C_{84}$. The fullerene derivative may be any, provided that it has a fullerene framework. Examples of the fullerene derivative are a fullerene oxide being any of these fullerenes whose carbon atoms at least partly are oxidized, a compound in which part of carbon atoms of a fullerene framework is modified by optional functional groups, and a compound in which these functional groups are bonded to form a ring.

As the compound represented by the formula (1), which is contained in the organic active layer 16, n is preferable to be 2 to 13, and n is more preferable to be 5 to 10 from a viewpoint of the power conversion efficiency. Examples of the compound represented by the formula (1) are octanedithiol, dibromooctane, diiodooctane, diiodohexane, and diiodobutane. Only one kind of these may be used, or two or more kinds of these may also be mixed to be used. Among these, the octanedithiol, the dibromooctane, and the diiodooctane are preferable from a viewpoint of the power conversion efficiency.

The concentration of the compound represented by the formula (1) in the organic active layer 16 is less than 0.1 mass %. When the concentration is less than 0.1 mass %, a decrease in the power conversion efficiency during use is suppressed. From a viewpoint of suppressing a decrease in the power conversion efficiency during use, the concentration of the compound represented by the formula (1) is preferable to be 0.095 mass % or less and more preferable to be 0.09 mass % or less. Here, the concentration of the compound represented by the formula (1) can be adjusted, as will be described later, by drying conditions such as a pressure and a temperature at which the organic active layer 16 is formed.

Further, the concentration of the compound represented by the formula (1) in the organic active layer 16 is 0.001 mass % or more to less than 0.1 mass %. When the concentration becomes 0.001 mass % or more, the power conversion efficiency in an early stage, namely the power conversion efficiency immediately after manufacture increases. From a viewpoint of increasing the power conversion efficiency in an early stage, the concentration is more preferable to be 0.01 mass % or more. On the other hand, when the concentration of the compound represented by the formula (1) is 0.1 mass % or more, the decrease in the power conversion efficiency during use may become large.

The organic active layer 16 has a bulk hetero junction structure containing a mixture of the p-type semiconductor and the n-type semiconductor, for example. The bulk hetero junction type organic active layer 16 has a microphase-separated structure of the p-type semiconductor and the n-type semiconductor. A p-type semiconductor phase and an n-type semiconductor phase are separated from each other to form a pn junction on a nanometer order. When the organic active layer 16 absorbs light, positive charges (holes) and negative charges (electrons) are generated at an interface of these phases and they are transported to the first electrode layer 12 and the second electrode layer 14 through the respective semiconductors. A composition ratio of the p-type semiconductor to the n-type semiconductor is preferable to be, in a mass ratio, the p-type semiconductor: the n-type semiconductor=1 to 99:99 to 1, and more preferable to be 20 to 80:80 to 20.

The thickness of the organic active layer 16 is normally preferable to be 10 to 1000 nm and further preferable to be 50 to 500 nm. When the thickness of the organic active layer 16 becomes 10 nm or more, the p-type semiconductor and the n-type semiconductor are mixed uniformly to be unlikely to cause a short circuit. Further, when the thickness of the organic active layer 16 becomes 1000 nm or less, internal resistance becomes small and the distance between the first electrode layer 12 and the second electrode layer 14 becomes closer, so that charges are well diffused. The organic active layer 16 can be suitably formed by applying the coating solution containing the p-type semiconductor and the n-type semiconductor.

The first intermediate layer 15 is provided as necessary. For example, the first intermediate layer 15 functions as an electron transport layer to block the hole generated in the organic active layer 16 and to selectively and efficiently transport the electron to the first electrode layer 12. The first intermediate layer 15 can be constituted of a metal oxide or an organic material. Examples of the metal oxide are a zinc oxide, a titanium oxide, and a gallium oxide. Examples of the organic material are polyethyleneimine.

The second intermediate layer 17 is provided as necessary. For example, the second intermediate layer 17 functions as a hole transport layer to block the electron generated in the organic active layer 16 and to selectively and efficiently transport the hole to the second electrode layer 14. The second intermediate layer 17 can be constituted of an organic conductive polymer or a metal oxide. Examples of the organic conductive polymer are PEDOT/PSS, polythiophene, polypyrrole, polyacethylene, triphenylenediaminepolypyrrole, and polyaniline. Examples of the metal oxide are a molybdenum oxide and a vanadium oxide.

The first intermediate layer 15 and the second intermediate layer 17 can be formed by a vacuum film-forming method such as a vacuum deposition method or a sputtering method, a sol-gel method, a coating method, or the like, for example.

The second electrode layer 14 is constituted of a material that has conductivity and has a light transmission property in some cases. As a constituent material of the second electrode layer 14, it can be constituted of a metal, a conductive metal oxide, a conductive polymer, or a carbon material. Examples of the metal are platinum, gold, silver, copper, nickel, cobalt, iron, manganese, tungsten, titanium, zirconium, tin, zinc, aluminum, indium, chromium, lithium, sodium, potassium, rubidium, cesium, calcium, magnesium, barium, samarium, terbium, and an alloy of these. Examples of the conductive metal oxide are an indium-zinc oxide (IZO). Examples of the conductive polymer are PEDOT/PSS. Examples of the carbon material are graphene and a carbon nano tube. The second electrode layer 14 can be formed by a vacuum film-forming method such as a vacuum deposition method or a sputtering method, a sol-gel method, a coating method, or the like, for example.

The sealing substrate 18 is for protecting the photoelectric conversion layer 13 from moisture and the like and making the photoelectric conversion layer 13 exhibit its characteristics for a long time. The sealing substrate 18 may be either an inorganic material or an organic material. Examples of the sealing substrate 18 are a metal substrate, a glass substrate, and a composite substrate obtained by depositing a metal film on a resin film. When light entering from the sealing substrate 18 side is used, a material having a light transmitting property is used for the sealing substrate 18.

Next, there will be explained a method of manufacturing the photoelectric conversion device of the embodiment. The method of manufacturing the photoelectric conversion device of the embodiment is suitably used for manufacture of the organic active layer in particular.

The method of manufacturing the photoelectric conversion device of the embodiment includes a coating step and a drying step. In the coating step, a coating solution containing a p-type semiconductor, an n-type semiconductor, and a compound represented by the following formula (1) is applied on a substrate. In the drying step, the coating solution on the substrate is dried under a condition that a pressure is 100 Pa or less and a temperature of the substrate is 40 to 200° C. Hereinafter, the respective steps will be explained concretely.

$$R^1\text{—}(CH_2)_n\text{—}R^2 \qquad (1)$$

n: 1 to 20

R1, R2: halogen (fluorine (F), chlorine (Cl), bromine (Br), or iodine (I)) or SH In the coating step, the coating solution containing the p-type semiconductor, the n-type semiconductor, and the compound represented by the formula (1) is first prepared. The coating solution can be prepared by adding the p-type semiconductor, the n-type semiconductor, and the compound represented by the formula (1) to a solvent and mixing the resultant mixture. Concrete examples of the p-type semiconductor, the n-type semiconductor, and the compound represented by the formula (1) have been already explained, so that their explanations are omitted.

Examples of the solvent are tetrahydrofuran, 1,2-dichloroethane, cyclohexane, chloroform, bromoform, benzene, toluene, o-xylene, chlorobenzene, bromobenzene, iodobenzene, o-dichlorobenzene, anisole, methoxybenzene, trichlorobenzene, and pyridine. These solvents may be used alone, or two kinds or more of these may also be mixed to be used. Among these, the o-dichlorobenzene, the chlorobenzene, the bromobenzene, the iodobenzene, and the chloroform, which are high in solubility with each of the p-type semiconductor and the n-type semiconductor, and a mixture of these are preferable, and the o-dichlorobenzene, the chlorobenzene, and a mixture of these are more preferable.

The total added amount of the p-type semiconductor and the n-type semiconductor is preferable to be 0.5 mass % or more and more preferable to be 0.9 mass % or more to 100 mass % of the coating solution from viewpoints of a reduction in energy to be consumed in the drying step of the solvent, speeding up of a drying rate, and the like. Further, the total added amount of the p-type semiconductor and the n-type semiconductor is preferable to be 4.2 mass % or less and more preferable to be 2.6 mass % or less to 100 mass % of the coating solution from viewpoints of solubility, dispersibility, suppression of an increase in viscosity of the coating solution, and the like.

The added amount of the compound represented by the formula (1) is preferable to be 21.6 mass % or more and more preferable to be 47.9 mass % or more to 100 mass % of the total of the p-type semiconductor, the n-type semiconductor, and the compound represented by the formula (1) from a viewpoint of increasing the power conversion efficiency in an early stage, namely the power conversion efficiency immediately after manufacture. Further, the added amount of the compound represented by the formula (1) is preferable to be 94.8 mass % or less and more preferable to be 90.2 mass % or less to 100 mass % of the total of the p-type semiconductor, the n-type semiconductor, and the compound represented by the formula (1) from a viewpoint of suppressing the decrease in the power conversion efficiency during use, which is caused by a residue.

The coating solution is applied on the substrate by using various coating methods. As the substrate, the supporting substrate having the first electrode layer in the organic photovoltaic cell can be cited. Incidentally, the supporting substrate may have the first intermediate layer in addition to the first electrode layer.

As the coating method, a method that has been known until now can be employed. For example, there can be employed a coating method such as an immersion coating method, a spray coating method, an ink jet method, an aerosol jet method, a spin coating method, a bead coating method, a wire bar coating method, a blade coating method, a roller coating method, a curtain coating method, a slit die coater method, a gravure coater method, a slit reverse coater method, a microgravure method, a comma coater method, or a meniscus coating method. Among these, the coating is preferably performed by the meniscus coating method.

Figure 2:
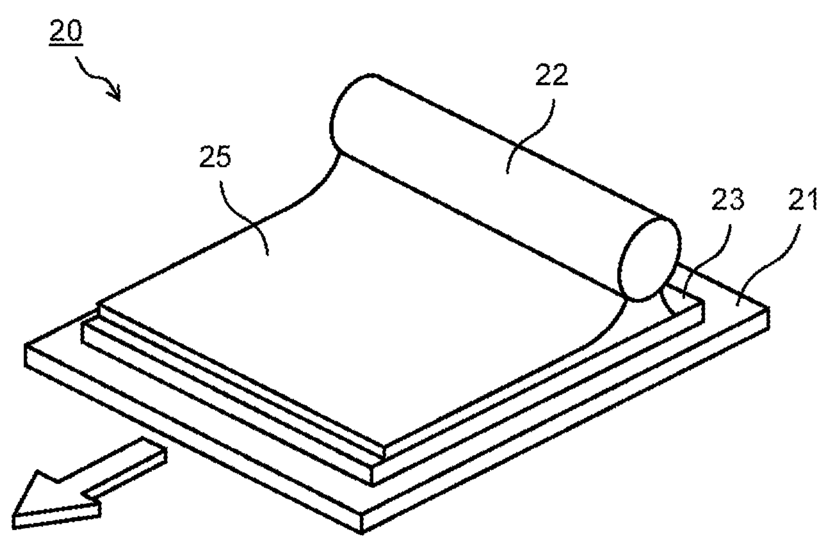
FIG. 2 is an external view explaining a coating method by a meniscus coating method.
Figure 3:
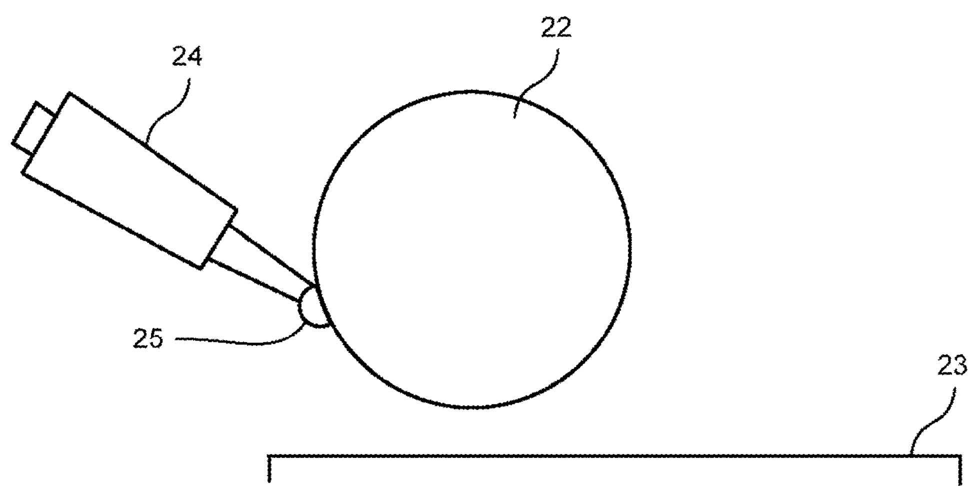
FIG. 3 is a view explaining a method of supplying a coating solution in the meniscus coating method.
Figure 4:
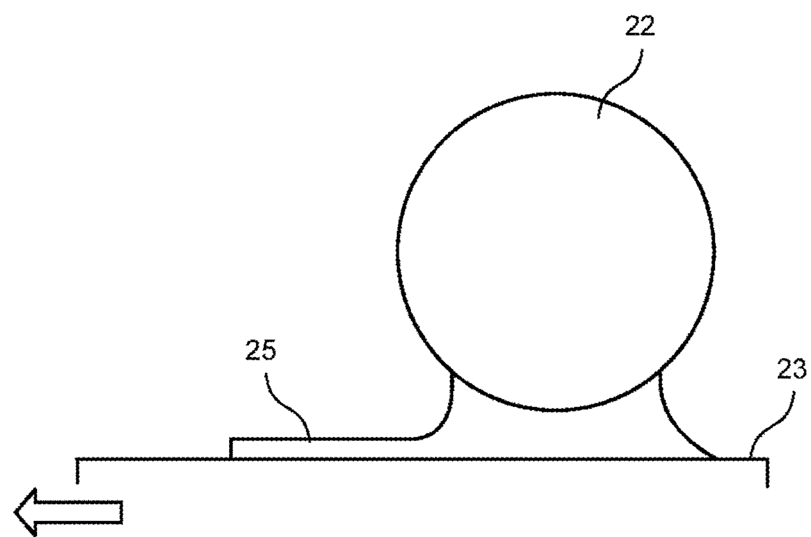
FIG. 4 is an enlarged view explaining the coating method by the meniscus coating method.

FIG. 2 to FIG. 4 are views each explaining the coating method of the coating solution by the meniscus coating method.

In the meniscus coating method, a meniscus coating apparatus 20 illustrated in FIG. 2 is used. The meniscus coating apparatus 20 has a plate-shaped stage 21 and a column-shaped coating head 22 that is disposed to face this stage 21, for example. The position of the coating head 22 is fixed. The stage 21 is movable horizontally with respect to the coating head 22.

The substrate as a coating object 23 is disposed on the stage 21. Here, as the substrate being the coating object 23, the supporting substrate in the organic photovoltaic cell on which the first electrode layer is disposed, or the supporting substrate on which the first electrode layer and the first intermediate layer are disposed can be cited.

As illustrated in FIG. 3, a coating solution 25 is supplied to the coating head 22 from a supply device 24 so as to spread over the entire region in a width direction of the coating head 22. Then, as illustrated in FIG. 4, the stage 21 is moved horizontally in a state where the position of the coating head 22 is fixed. Thereby, the coating object 23 disposed on the stage 21 is moved with respect to the coating head 22. As a result, the coating solution 25 is spread by the coating head 22 to coat the coating object 23. Incidentally, the coating head 22 is normally used in an irrotational state.

In the drying step, the coating solution coated on the substrate is dried under the condition that the pressure is 100 pa or less and the temperature of the substrate is 40 to 200° C.

Heating is performed so that the temperature of the substrate becomes 40° C. or more, and thereby a binding force of the p-type semiconductor and the n-type semiconductor to the compound represented by the formula (1) decreases to make the compound represented by the formula (1) likely to be removed from the coating solution (coated film) on the substrate. This makes the concentration of the compound represented by the formula (1) in the organic active layer become less than 0.1 mass %. From a viewpoint of removing the compound represented by the formula (1), the heating is preferably performed so that the temperature of the substrate becomes 45° C. or more.

Incidentally, when the temperature of the substrate exceeds 200° C., the microphase-separated structure of the p-type semiconductor and the n-type semiconductor, namely, the bulk hetero structure deteriorates or the materials of the p-type semiconductor and the n-type semiconductor deteriorate, resulting in a decrease in the power conversion efficiency. Therefore, the heating is performed so that the temperature of the substrate becomes 200° C. or less. The heating is preferably performed so that the temperature of the substrate becomes 160° C. or less, and the heating is more preferably performed so that the temperature of the substrate becomes 100° C. or less.

Further, reducing the pressure to 100 Pa or less enables the compound represented by the formula (1) to be removed from the coating solution (coated film) on the substrate sufficiently, in combination with the fact that the heating makes the compound represented by the formula (1) likely to be removed. From a viewpoint of removing the compound represented by the formula (1), the pressure is preferable to be 1 Pa or less and more preferable to be $1\times10^{-3}$ Pa or less. Incidentally, even if the pressure is lowered more, it is sufficient to lower the pressure down to $1\times10^{-4}$ Pa. As the pressure becomes lower, the compound represented by the formula (1) becomes more likely to be removed, but there is a limit in terms of it. On the other hand, time for reducing the pressure becomes long.

For the pressure reduction, a rotary pump, a turbopump, a cryopump, and the like can be used. For example, after the pressure is roughly reduced by the rotary pump, the pressure is fully reduced by the turbopump and the cryopump, resulting in that the pressure can be reduced efficiently. Using the turbopump or the cryopump makes it possible to reduce the pressure to $1\times10^{-4}$ Pa or less.

The time for the drying step, namely the time during which the above-described temperature condition and pressure condition are satisfied simultaneously is preferable to be 1 minute or more and more preferable to be 10 minutes or more from a viewpoint of removing the compound represented by the formula (1). On the other hand, from viewpoints of suppressing a decrease in productivity and a decrease in the power conversion efficiency to be caused by deterioration of the p-type semiconductor and the n-type semiconductor, the time for the drying step is preferable to be 180 minutes or less and more preferable to be 60 minutes or less.

EXAMPLES

Hereinafter, the present invention will be concretely explained with reference to examples. Incidentally, the present invention is not limited to these examples.

Example 1

A coating solution to be used for formation of the organic active layer is prepared as follows. To 1.94 ml of monochlorobenzene as the solvent, 0.06 ml of 1,8-diiodooctane as the compound represented by the formula (1), 16 mg of PTB7 ([poly {4,8-bis[(2-ethylhexyl)oxy]benz[1,2-b: 4, 5-b'] dithiophene-2,6-diyl-lt-alt-3-fluor-2-[(2-ethylhexyl)carbonyl]thieno[3,4-b]thiophene-4,6-diyl}]) being a polymer as the p-type semiconductor, and 24 mg of PC70BM ([6,6] phenylC71butyric acid methylester) being a fullerene derivative as the n-type semiconductor are added. This mixed solution is stirred and dispersed for 20 minutes at 80° C., and then the temperature returns to room temperature and the resultant mixed solution is prepared as the coating solution to be used for formation of the organic active layer.

Besides, one obtained by providing an ITO film as the first electrode layer on a non-alkali glass plate as the supporting substrate is prepared, and is cleaned by UV ozone as a pretreatment. Next, as the first intermediate layer, a PEIE (polyethyleneimineethoxylate) film having a thickness of about 1 nm is formed. Here, there is used PEIE in which 80% of amine is denatured into ethoxylate. Hereinafter, the non-alkali glass plate having the ITO film and the PEIE is described as an object substrate.

Next, on the stage 21 in the meniscus coating apparatus 20 illustrated in FIG. 2, the above-described object substrate as the coating object 23 is disposed. Further, the coating head 22 is disposed above this object substrate being the coating object 23 to have a gap of 0.88 mm therebetween.

Thereafter, as illustrated in FIG. 3, by using the supply device 24, the coating solution 25 is supplied so as to spread over the entire region in the width direction of the coating head 22. Then, as illustrated in FIG. 4, the stage 21 is moved horizontally at a 10 mm/s speed in a state where the position of the coating head 22 is fixed, and the coating solution 25 is applied on the object substrate being the coating object 23.

Next, this object substrate having the coating solution (coated film) is put in a vacuum deposition machine, and by using a rotary pump, the pressure is lowered to 60 Pa for 20 minutes. Further, by using a cryopump, the pressure is lowered to $5\times10^{-5}$ Pa for 15 minutes. In this state, heating is performed for 10 minutes until the temperature of the object substrate becomes 47° C. from 25° C., and further maintaining at this temperature is performed for 1 minute. Thereby, the coated film is dried and the organic active layer is formed. The thickness of the organic active layer is about 90 nm. Incidentally, the pressure is confirmed using an ion gauge. Further, the temperature of the object substrate is confirmed using a thermocouple.

This object substrate having the organic active layer is taken out of the vacuum deposition machine, and a deposition mask is set on this object substrate to be put in the vacuum deposition machine again. Thereafter, as the second intermediate layer, a $V_2O_5$ film having a thickness of about 10 nm, and as the second electrode layer, an Ag film having a thickness of about 100 nm are deposited sequentially. After the deposition, the substrate is taken out of the vacuum deposition machine.

Besides, as the sealing substrate, a glass having a recessed portion in its center portion, namely a counterbored glass is prepared. A desiccant is applied to a counterbored portion (the recessed portion) of this counterbored glass, and an UV curing epoxy adhesive to be an adhesive layer is applied to a surrounding non-counterbored portion. This sealing substrate is laminated on the object substrate having the organic active layer, and an organic photovoltaic cell is manufactured.

When, of this organic photovoltaic cell, power conversion efficiency immediately after manufacture (power conversion efficiency in early stage in the table) is measured, it is 6.50%. Further, when the power conversion efficiency of the organic photovoltaic cell after a dry heat test at 85° C., for 1000 hours, and under a nitrogen atmosphere (power conversion efficiency after test in the table) is measured, it is 6.25%. Further, when a decrease rate of the power conversion efficiency after the dry heat test is found from these measurement results, it is 3.8%. Incidentally, the power conversion efficiency is measured by using a solar simulator with a reference spectrum of 100 mW/cm$^2$ irradiance and AM 1.5 G.

Besides, as for the organic photovoltaic cell immediately after manufacture, namely the organic photovoltaic cell that is not subjected to a dry heat test, the concentration of 1,8-diiodooctane in the organic active layer is measured as follows. First, after the counterbored glass being the sealing substrate is removed, the $V_2O_5$ film being the second intermediate layer and the Ag film being the second electrode layer are removed by etching to expose the organic active layer. Thereafter, an XPS (X-ray Photoelectron Spectroscopy) analysis and etching of the organic active layer are repeatedly performed alternately and the concentration of 1,8-diiodooctane in the organic active layer in mol % is measured in the entire region in a thickness direction. The concentrations in mol % in this thickness direction are averaged to be further converted into a concentration in mass %. Incidentally, the detection limit of the 1,8-diiodooctane by the XPS analysis is considered to be 0.001 mass %.

Example 2

A substrate having a coated film is manufactured in the same manner as in Example 1. Thereafter, the pressure is lowered to 15 Pa in 20 minutes, and then heating is performed at 15 Pa for 10 minutes until the temperature of an object substrate becomes 46° C., and further maintaining at this temperature is performed at 15 Pa for 1 minute, and an organic active layer is formed. Incidentally, the thickness of the organic active layer is set to the same as that in Example 1. Thereafter, manufacture and evaluation of an organic photovoltaic cell are performed in the same manner as in Example 1.

Example 3

A substrate having a coated film is manufactured in the same manner as in Example 1. Thereafter, the pressure is lowered to 15 Pa in 20 minutes, and then heating is performed at 15 Pa for 10 minutes until the temperature of an object substrate becomes 150° C., and further maintaining at this temperature is performed at 15 Pa for 1 minute, and an organic active layer is formed. Incidentally, the thickness of the organic active layer is set to the same as that in Example 1. Thereafter, manufacture and evaluation of an organic photovoltaic cell are performed in the same manner as in Example 1.

Comparative Example 1

A substrate having a coated film is manufactured in the same manner as in Example 1. Thereafter, at normal pressure, heating is performed for 20 seconds until the temperature of an object substrate becomes 70° C., and further maintaining at this temperature is performed for 30 minutes, and an organic active layer is formed. Incidentally, the thickness of the organic active layer is set to the same as that in Example 1. Thereafter, manufacture and evaluation of an organic photovoltaic cell are performed in the same manner as in Example 1.

Comparative Example 2

A substrate having a coated film is manufactured in the same manner as in Example 1. Thereafter, the pressure is lowered to $5\times10^{-5}$ Pa in the same manner as in Example 1, and then heating is performed for 10 minutes until the temperature of an object substrate becomes 30° C., and further maintaining at this temperature is performed for 1 minute, and an organic active layer is formed. Incidentally, the thickness of the organic active layer is set to the same as that in Example 1. Thereafter, manufacture and evaluation of an organic photovoltaic cell are performed in the same manner as in Example 1.

Comparative Example 3

A substrate having a coated film is manufactured in the same manner as in Example 1. Thereafter, the pressure is lowered to 15 Pa for 20 minutes, and then heating is performed for 10 minutes until the temperature of an object substrate becomes 39° C., and further maintaining at this temperature is performed for 1 minute, and an organic active layer is formed. Incidentally, the thickness of the organic active layer is set to the same as that in Example 1. Thereafter, manufacture and evaluation of an organic photovoltaic cell are performed in the same manner as in Example 1.

TABLE 1

| | | | | Power conversion efficiency | | |
|---|---|---|---|---|---|---|
| | Pressure | Temperature | Concentration [mass %] | Early stage [%] | After test [%] | Decrease rate [%] |
| Example 1 | $5 \times 10^{-5}$ Pa | 47° C. | 0.08 | 6.50 | 6.25 | 3.8 |
| Example 2 | 15 Pa | 46° C. | 0.09 | 6.12 | 5.82 | 4.9 |
| Example 3 | 15 Pa | 150° C. | 0.05 | 2.40 | 2.29 | 4.6 |
| Comparative Example 1 | Normal pressure | 70° C. | 5.28 | 6.72 | 4.37 | 35.0 |
| Comparative Example 2 | $5 \times 10^{-5}$ Pa | 30° C. | 8.70 | 6.71 | 5.17 | 23.0 |
| Comparative Example 3 | 15 Pa | 39° C. | 0.12 | 6.44 | 5.83 | 9.5 |

As is clear from Table 1, in Examples 1 to 3 in which the coated film is dried under the condition that the pressure is 100 Pa or less and the temperature of the substrate is 40 to 200° C., the decrease rate of the power conversion efficiency after the dry heat test becomes 5% or less. In Example 1 in particular, the power conversion efficiency in an early stage is high and the decrease rate of the power conversion efficiency after the dry heat test is small.

Further, in Examples 1 to 3 in which the concentration of 1,8-diiodooctane in the organic active layer is less than 0.1 mass %, the decrease rate of the power conversion efficiency after the dry heat test becomes 5% or less. Here, requirements of 10.13 damp heat test in JIS C8990 "Crystalline silicon terrestrial photovoltaic (PV) modules-Design qualification and type approval" include one in which the decrease rate at 85° C. and 85% RH and for 1000 h is 5% or less. According to the above, it is greatly significant also in the organic photovoltaic cell that the decrease rate at a dry heat test at 85° C. and for 1000 h is 5% or less.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The inventions described in the accompanying claims and their equivalents are intended to cover such forms or modifications as would fall within the scope and spirit of the inventions.

What is claimed is:

1. A method of manufacturing a photoelectric conversion device, comprising:

preparing a substrate;

forming a layer on the substrate, the layer including a p-type semiconductor, an n-type semiconductor, and a compound represented by the following formula (1); and drying the layer under a pressure of 100 Pa or less and a substrate temperature of 40to 200° C., wherein the formed layer contains 47.9 mass % or more of the compound, and the dried layer contains 0.001 mass % or more and less than 0.1 mass % of the compound;

$$R^1—(CH_2)_n—R^2 \quad (1)$$

n: 1 to 20

R1, R2: halogen or SH.

2. The method of claim 1, wherein the forming the layer includes:

forming a mixture of the p-type semiconductor, the n-type semiconductor, the compound, and a solvent; and applying the mixture on the substrate to form the layer wherein the drying the layer includes evaporating the solvent in the layer.

3. The method of claim 1, wherein the pressure is 1 $\times 10^{-3}$ Pa or less and the temperature is 40 to 160° C.

4. The method of claim 1, wherein the dried layer includes a microphase-separated structure of the p-type semiconductor and the n-type semiconductor.

5. The method of claim 1, wherein the p-type semiconductor includes a polymer.

6. The method of claim 1, wherein the n-type semiconductor includes a fullerene derivative.

7. The method of claim 1, wherein then of the compound is 5 to 10.

8. The method of claim 1, wherein the compound includes octanedithiol, dibromooctane, and diiodooctane.

9. The method of claim 1, wherein the compound includes 1,8-diiodooctane.

10. The method of claim 9, further comprising:

forming a first electrode layer on the substrate before the forming the layer; and forming a second electrode layer on the layer to form the photoelectric conversion device.

11. The method of claim 10, further comprising:

wherein the power conversion efficiency of the photovoltaic conversion device decreases by 5% or less after the device keeps under a temperature of 85° C. and an atmosphere of nitrogen for 1000 hours.

12. The method of claim 1, wherein the concentration (mass %) of the compound is defined by the ratio of the mass of the compound with respect to the total mass of the p-type semiconductor, the n-type semiconductor, and the compound.

* * * * *